US008957465B2

(12) United States Patent
Xie et al.

(10) Patent No.: US 8,957,465 B2
(45) Date of Patent: Feb. 17, 2015

(54) FORMATION OF THE DIELECTRIC CAP LAYER FOR A REPLACEMENT GATE STRUCTURE

(71) Applicants: Globalfounfries Singapore Pte. Ltd., Singapore (SG); International Business Machines Corporation, Armonk, NY (US)

(72) Inventors: Ruilong Xie, Albany, NY (US); Balasubramanian Pranatharthi Haran, Watervliet, NY (US); David V. Horak, Essex Junction, VT (US); Su Chen Fan, Cohoes, NY (US)

(73) Assignees: GLOBALFOUNDRIES Singapore Pte. Ltd., Singapore (SG); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/285,852

(22) Filed: May 23, 2014

(65) Prior Publication Data
US 2014/0299924 A1    Oct. 9, 2014

Related U.S. Application Data

(62) Division of application No. 13/353,708, filed on Jan. 19, 2012, now Pat. No. 8,772,168.

(51) Int. Cl.
| H01L 29/78 | (2006.01) |
| H01L 21/336 | (2006.01) |
| H01L 29/423 | (2006.01) |
| H01L 21/28 | (2006.01) |
| H01L 29/49 | (2006.01) |
| H01L 29/66 | (2006.01) |

(52) U.S. Cl.
CPC .... *H01L 29/42376* (2013.01); *H01L 21/28088* (2013.01); *H01L 29/4966* (2013.01); *H01L 29/66545* (2013.01); *H01L 29/78* (2013.01)

USPC .............. 257/288; 257/382; 257/E29.116; 257/E21.575; 438/299

(58) Field of Classification Search
None
See application file for complete search history.

(56) References Cited

U.S. PATENT DOCUMENTS

| 2001/0049183 A1 | 12/2001 | Henson et al. |
| 2009/0057730 A1 | 3/2009 | Furukawa et al. |
| 2010/0068875 A1 | 3/2010 | Yeh et al. |
| 2011/0062501 A1 | 3/2011 | Soss et al. |
| 2011/0156107 A1* | 6/2011 | Bohr et al. .................... 257/288 |
| 2013/0015532 A1 | 1/2013 | Kim et al. |

OTHER PUBLICATIONS

K. Mistry et al. A 45nm Logic Technology with High-k+Metal Gate Transistors, Strained Silicon, 9 Cu Interconnect Layers, 193nm Dry Patterning, and 100% Pb-free Packaging, IEDM 2007; pp. 247-250.

* cited by examiner

*Primary Examiner* — Sonya D McCall Shepard
(74) *Attorney, Agent, or Firm* — Ditthavong & Steiner, P.C.

(57) ABSTRACT

Gate to contact shorts are reduced by forming dielectric caps in replaced gate structures. Embodiments include forming a replaced gate structure on a substrate, the replaced gate structure including an ILD having a cavity, a first metal on a top surface of the ILD and lining the cavity, and a second metal on the first metal and filling the cavity, planarizing the first and second metals, forming an oxide on the second metal, removing the oxide, recessing the first and second metals in the cavity, forming a recess, and filling the recess with a dielectric material. Embodiments further include dielectric caps having vertical sidewalls, a trapezoidal shape, a T-shape, or a Y-shape.

17 Claims, 14 Drawing Sheets

FORMATION OF THE DIELECTRIC CAP LAYER FOR A REPLACEMENT GATE STRUCTURE

CROSS REFERENCE TO RELATED APPLICATIONS

This application is a divisional application of U.S. application Ser. No. 13/353,708, filed Jan. 19, 2012, the content of which is incorporated herein by reference.

TECHNICAL FIELD

The present disclosure relates to methods for forming dielectric cap layers on replacement metal gates. The present disclosure is particularly applicable to 14 nanometer (nm) technology nodes and beyond.

BACKGROUND

Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance. Replacement gate techniques have been developed to address problems attendant upon substituting metal gate electrodes for polysilicon gate electrodes. For example, a polysilicon gate is used during initial processing until high temperature annealing to activate source/drain implants has been implemented. Subsequently, the polysilicon is removed and replaced with a metal gate.

As transistor pitch scales down to 64 nanometers (nm) and below, borderless, or self-aligned (SAC), contacts are essentially required to avoid massive gate to source/drain contact shorts, to reduce source/drain resistance by enabling an increase in the width of contact plugs, and to increase the lithography/etching process window for stringent critical dimension and T2T requirements. An SAC contact compatible flow is critically important for 14 nm technologies and below. Formation of a dielectric cap layer on top of the replacement metal gate (RMG) structure is a key process to enable the SAC contact for the gate last CMOS flow.

Prior attempts to form a dielectric cap layer for an RMG gate structure entail oxidizing, nitridizing, or fluorinating the top metal surface. However, those attempts necessitate a single type of metal for the top metal layer, while the top metal composition actually is complex. Further, for subsequent processes, a cap layer having a thickness of at least 15 nm is required, which is impractical with conventional oxidation, nitridation, and fluorination processes, particularly for 14 nm CMOS transistors. In addition, for high-k/metal gate stacks, there are stringent temperature and oxygen control requirements after the RMG is formed, which conflict with direct oxidation, nitridation, and fluorination processes.

A need therefore exists for methodology enabling formation of a thick dielectric cap layer for an RMG structure with no thermal budget or oxygen concerns, and the resulting structure.

SUMMARY

An aspect of the present disclosure is a method of forming a dielectric cap on a replaced metal gate.

Another aspect of the present disclosure is semiconductor device having a dielectric cap on a replaced metal gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a replaced gate structure on a substrate, the replaced gate structure including: an interlayer dielectric (ILD) having a cavity, a first metal on a top surface of the ILD and lining the cavity, and a second metal on the first metal and filling the cavity; planarizing the first and second metals; forming an oxide on the second metal; removing the oxide; recessing the first and second metals in the cavity, forming a recess; and filling the recess with a dielectric material.

Aspects of the present disclosure include the first metal being TiN, the second metal being aluminum (Al); and the oxide being aluminum oxide ($Al_2O_3$). Further aspects include planarizing the first and second metals down to the ILD. Other aspects include removing the oxide by a first etching; and recessing the first and second metals by a second etching. Another aspect includes recessing the first and second metals to a depth of 10 nm to 35 nm. Additional aspects include planarizing the first and second metals down to the first metal; and removing the first metal from the top surface of the ILD prior to filling the recess with a dielectric material. Further aspects include recessing the first and second metals by: etching the second metal to a depth of 10 nm to 40 nm below the top surface of the ILD, and etching the first metal to the same depth as the second metal; and removing the first metal from the top surface of the ILD concurrently with etching the first metal. Other aspects include forming the replaced gate structure by depositing the first metal on the ILD and in the cavity by physical vapor deposition, to a thickness of 1 nm to 10 nm. Additional aspects include planarizing the first and second metals down to the first metal; and recessing the first and second metals by: thinning the first metal on the top surface of the ILD concurrently with etching the first and second metals.

Another aspect of the present disclosure is a method including forming a replaced gate structure on a substrate, the replaced gate structure including: an ILD having a cavity, a first metal on a top surface of the ILD and lining the cavity, and a second metal on the first metal and filling the cavity; planarizing the first and second metals down to the top surface of the ILD; etching the first metal to form a recess on each side of the second metal; filling the recesses with the second metal; planarizing the second metal; and forming an oxide layer on the second metal.

Aspects include the second metal being Al; and the oxide being $Al_2O_3$. Further aspects include forming the oxide to a thickness of 10 nm to 20 nm. Another aspect includes nitridating, fluorinating, and/or oxidizing the second metal subsequent to forming the oxide layer.

Another aspect of the present disclosure is a device including: an ILD on substrate, the ILD having a cavity; gate spacers on sidewalls of the cavity; a first metal lining a bottom portion of the cavity between the gate spacers; a second metal filling the bottom portion of the cavity; and a dielectric cap in the top portion of the cavity.

Aspects include the dielectric cap having a thickness of 10 nm to 40 nm. Further aspects include the dielectric cap having vertical sidewalls. Another aspect includes the dielectric cap having a T-shape. A further aspect includes the dielectric cap having a Y-shape. Additional aspects include the dielectric cap having a trapezoidal shape with sidewalls closest to each other at a top surface of the first and second metals. Other aspects include the dielectric cap being $Al_2O_3$, aluminum oxynitride ($AlO_xN_y$), aluminofluoride ($AlF_x$), or fluorinated aluminum oxide ($AlF_xO_y$).

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of gate to contact shorts attendant upon insufficient dielectric cap formation in gate last CMOS processes. In accordance with embodiments of the present disclosure, a dielectric cap layer is formed in the top portion of a replacement gate, which allows self-aligned contacts to be formed, thereby isolating the gate metals from the contacts.

Methodology in accordance with embodiments of the present disclosure begins with forming a replaced gate structure on a substrate, the replaced gate structure including an ILD having a cavity, a first metal on a top surface of the ILD and lining the cavity, and a second metal on the first metal and filling the cavity. Methodology in accordance with embodiments of the present disclosure continues with planarizing the first and second metals, forming an oxide on the second metal, removing the oxide, recessing the first and second metals in the cavity, forming a recess, and filling the recess with a dielectric material.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
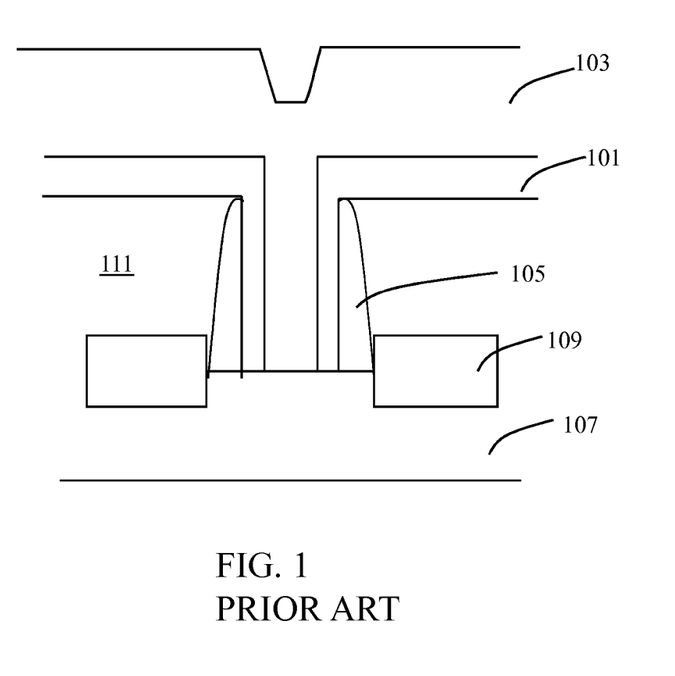
FIG. 1 schematically illustrates a conventional replaced gate structure.

All embodiments of the present disclosure begin with a conventional replacement gate structure, for example as illustrated in FIG. 1. The replacement gate includes metal gate 101 and metal fill 103 between insulating spacers 105, all on a semiconductor substrate 107. Source/drain regions 109 are formed on each side of the gate, and an ILD 111 fills the remaining space. Metal gate 101 may be a work function metal, such as titanium nitride (TiN), and may be formed to a thickness of 1 nm to 10 nm, metal fill 103 may be aluminum (Al) or tungsten (W) and may be formed to a thickness of 50 nm to 200 nm, and source/drain regions 109 may be raised or unraised, and may be with or without silicidation. Insulating spacers 105 may be formed of an oxide or a nitride, and ILD 111 may be formed of an oxide, a nitride, or a low-k dielectric.

FIGS. 2A through 2D illustrate a process flow in accordance with an exemplary embodiment. Adverting to FIG. 2A, metal gate 101 and metal fill 103 of FIG. 1 are etched back, for example by chemical mechanical polishing (CMP), stopping on ILD 111. A thin layer of aluminum oxide ($Al_2O_3$) 201 may be formed during the CMP process, for example to a thickness of 3 nm to 5 nm.

Figure 2A:
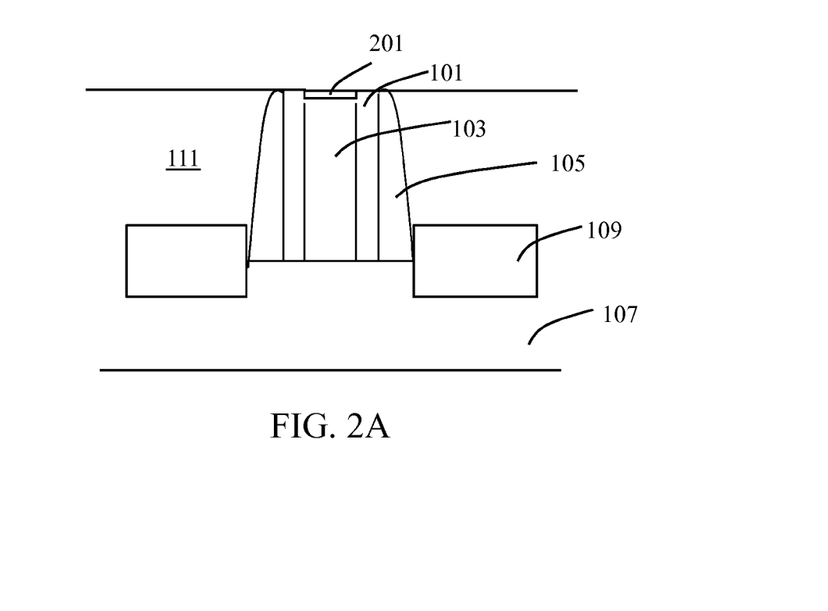
FIGS. 2A through 2D schematically illustrate a process flow for forming a dielectric cap, in accordance with an exemplary embodiment.
Figure 2B:
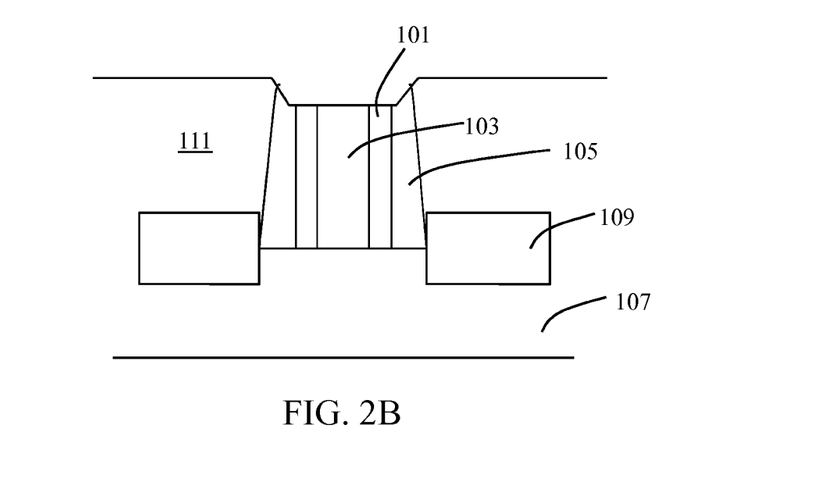

As illustrated in FIG. 2B, $Al_2O_3$ 201 is etched away into metal fill 103, metal gate 101, and spacers 105 to a depth of 5 nm to 15 nm. The etching may be performed by dry etching, for example by argon (Ar) bombardment or by boron trichloride ($BCl_3$) based chemistry, or by wet etching, such as by PNA, a mixture of phosphoric acid ($H_3PO_4$), deionized (DI) water, acetic acid ($CH_3CO_2H$), and nitric acid ($HNO_3$).

Figure 2C:
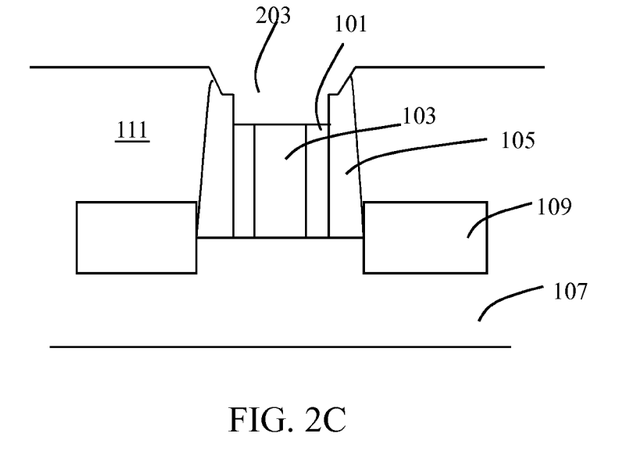

Metal gate 101 and metal fill 103 are then further etched back, for example 10 nm to 35 nm, forming recess 203, as illustrated in FIG. 2C. A dry etch process, for example $BCl_3$ based or methyl fluoride ($CH_3F$)/hydrogen bromide (HBr)/oxygen ($O_2$) based chemistry, may be employed, or a wet etch approach, such as PNA, hydrogen chloride (HCl), or $HNO_3$ may be used.

Figure 2D:
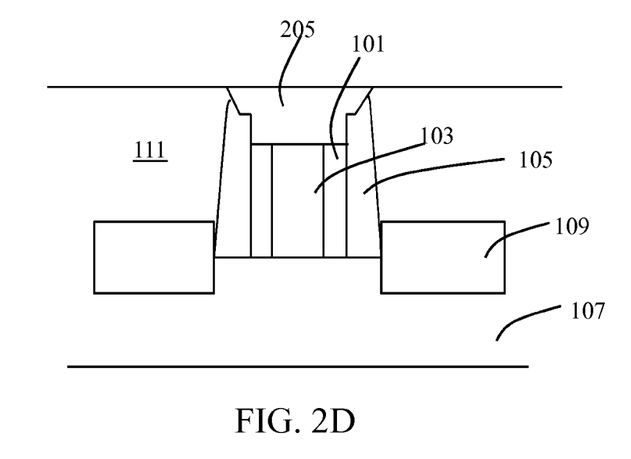
Figure 2E:
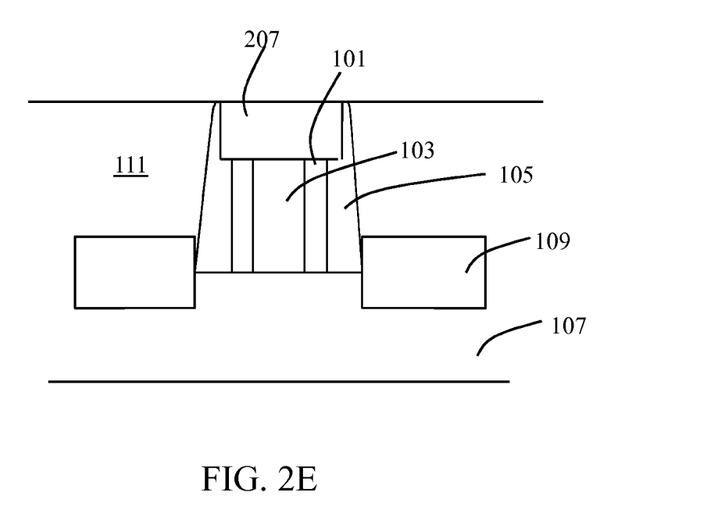
FIGS. 2E through 2H schematically illustrate alternative configurations for a dielectric cap formed in accordance with the first exemplary embodiment.
Figure 2F:
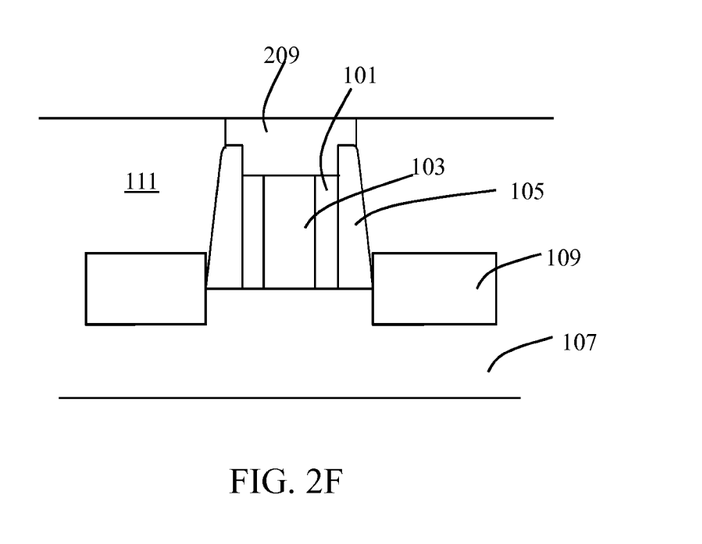
Figure 2G:
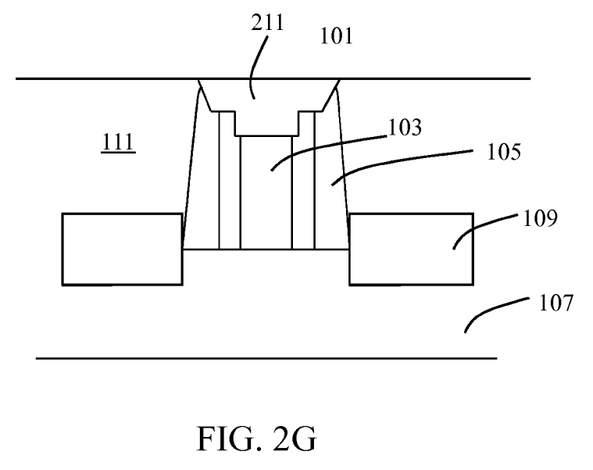
Figure 2H:
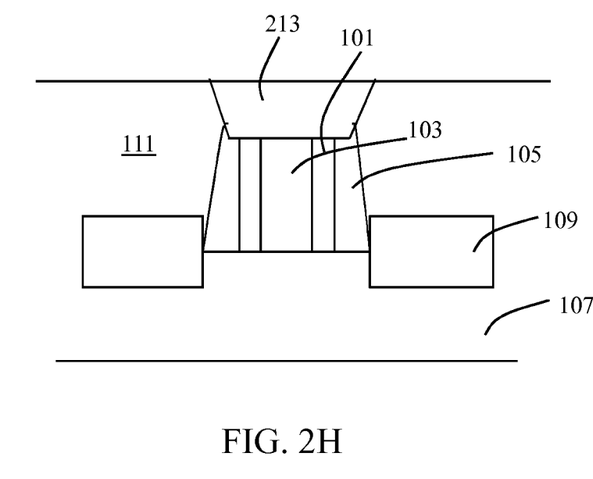

Adverting to FIG. 2D, recess 203 may then be filled with a dielectric material and polished to form dielectric cap 205. The dielectric material may be silicon nitride (SiN), silicon dioxide ($SiO_2$), hafnium oxide ($HfO_2$), etc.

Depending on the etch selectivity or integration and electrical preferences, different cap layer shapes might be desired or formed. FIGS. 2E through 2H illustrate alternative architectures for the dielectric cap formed by the method of FIGS. 2A through 2D. For example, as illustrated by 207 in FIG. 2E, the dielectric cap may be formed with vertical sidewalls, or as illustrated at 209 in FIG. 2F, the dielectric cap may be T-shaped. Alternatively, the dielectric cap may be Y-shaped, as shown by 211 in FIG. 2G, or trapezoidal, as shown by 213 in FIG. 2H.

Figure 3A:
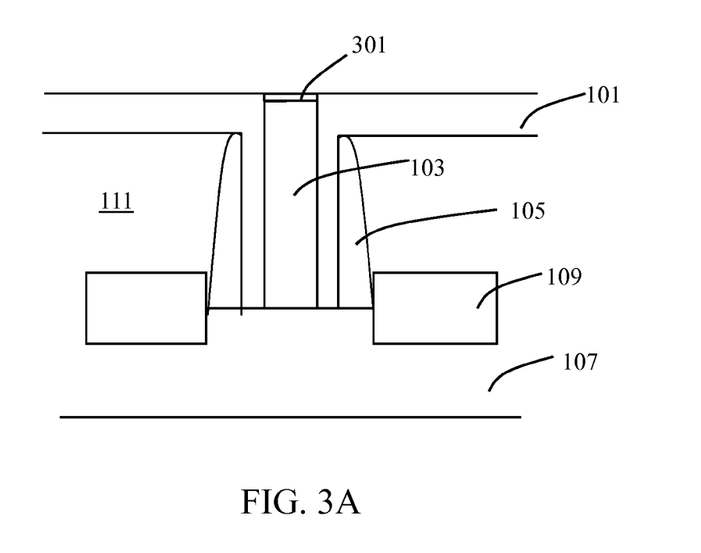
FIGS. 3A through 3E schematically illustrate a process flow for forming a dielectric cap, in accordance with another exemplary embodiment.

FIGS. 3A through 3E illustrate a process flow in accordance with another exemplary embodiment. As illustrated in FIG. 3A, metal fill 103 of FIG. 1 is etched back, for example by CMP, stopping on metal gate 101. A thin layer of $Al_2O_3$ 301 may be formed during the CMP process, for example to a thickness of 3 nm to 5 nm.

Figure 3B:
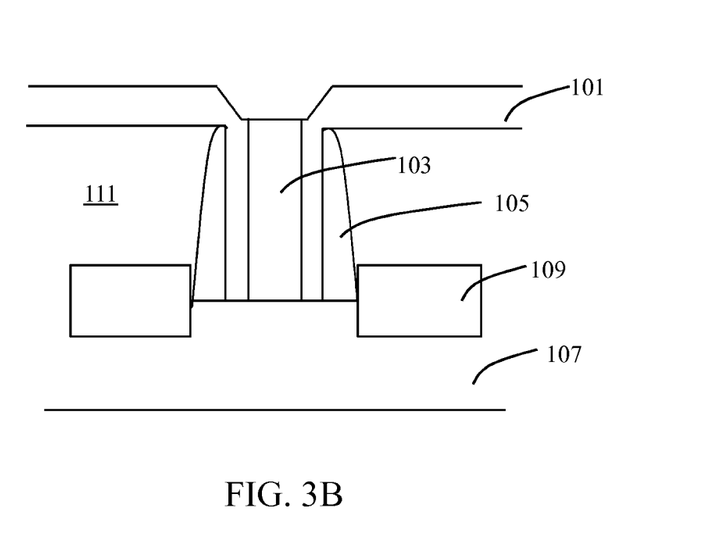

Adverting to FIG. 3B, $Al_2O_3$ 301 is etched away into metal fill 103 and metal gate 101 to a depth of 5 nm to 15 nm. The etching may be performed by dry etching, for example by Ar bombardment or by $BCl_3$ based chemistry, or by wet etching, such as by PNA. Since metal gate 101 remains atop ILD 111, the work function metal can protect the ILD from being damaged during the metal recess process, which is an advantage over the first embodiment.

Figure 3C:
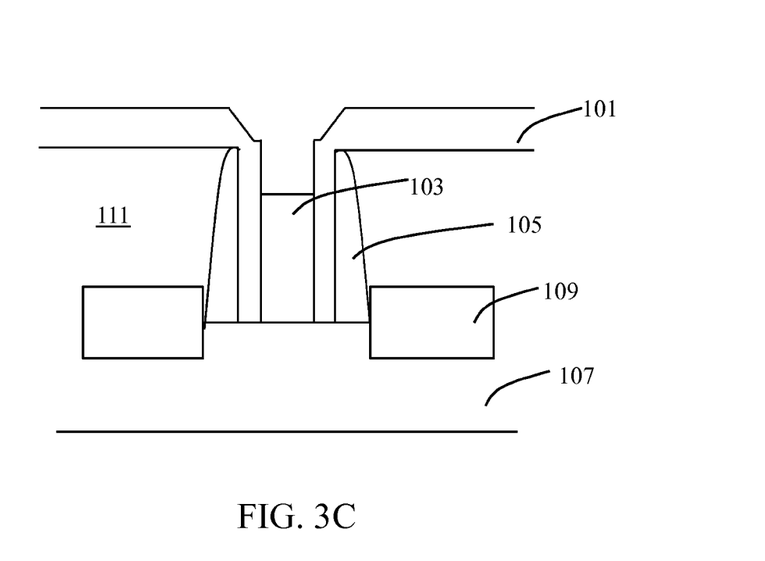

As illustrated in FIG. 3C, metal fill 103 is further etched, 10 nm to 40 nm, by a dry etch process or a wet etch process. For a dry etch process, $BCl_3$ based or $CH_3F/HBr/O_2$ based chemistries may be employed. For a wet etch approach, cyclic hydrogen peroxide $(H_2O_2)$/PNA, may be used.

Figure 3D:
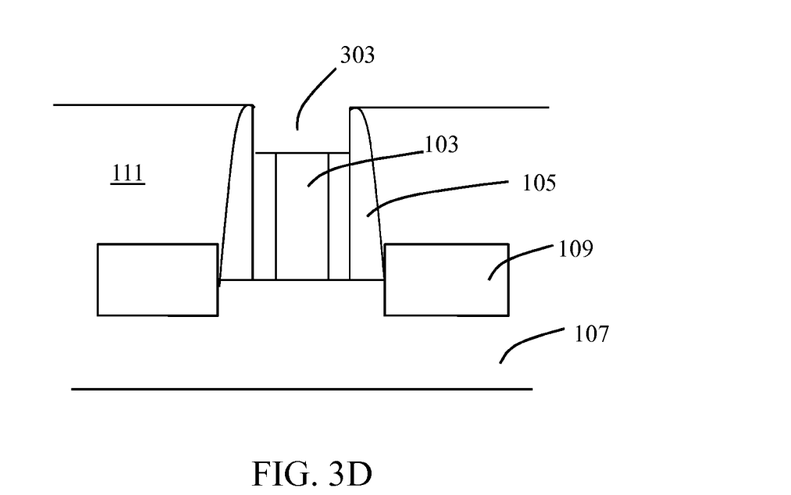

Next, metal gate 101 may be etched back by a dry or wet etch, for example by a peroxide solution at a temperature around 65° C., forming recess 303, as illustrated in FIG. 3D. Alternatively, the steps shown in FIGS. 3C and 3D may be reversed such that metal gate 101 is etched back prior to etching metal fill 103. As a further alternative, the steps shown in FIGS. 3C and 3D may be performed together, for example by an isotropic etch process.

Figure 3E:
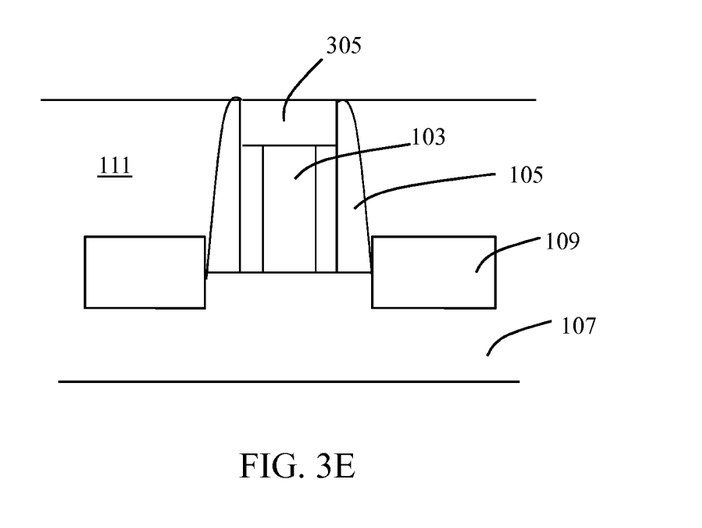

Adverting to FIG. 3E, recess 303 may then be filled with a dielectric material and polished to form dielectric cap 305. The dielectric material may be, for example, SiN, $SiO_2$, or $HfO_2$. The dielectric cap shapes shown in FIGS. 2E through 2H may also apply to the dielectric cap formed by the method of FIGS. 3A through 3E.

Figure 4A:
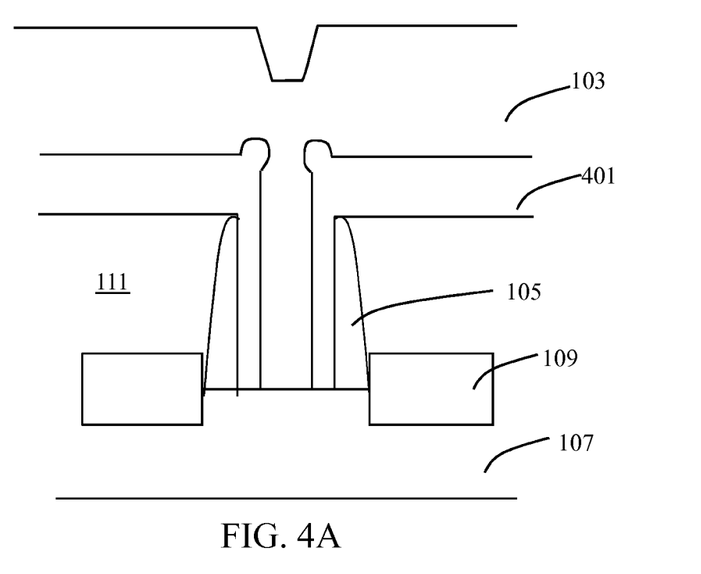
FIGS. 4A through 4E schematically illustrate a process flow for forming a dielectric cap, in accordance with another exemplary embodiment.

A process flow for forming a dielectric cap, in accordance with another exemplary embodiment, is illustrated in FIGS. 4A through 4E. The process begins with a conventional replacement gate structure similar to that of FIG. 1, but with metal gate 401 rather than metal gate 101. As illustrated in FIG. 4A, by forming metal gate 401 by physical vapor deposition, rather than the chemical vapor deposition (CVD) or atomic layer deposition (ALD) (which are employed in the formation of metal gate 101), metal gate 401 is thicker above ILD 111, for example 2 nm to 15 nm thick, and the space for metal fill 103 narrows at the top of metal gate 401.

Figure 4B:
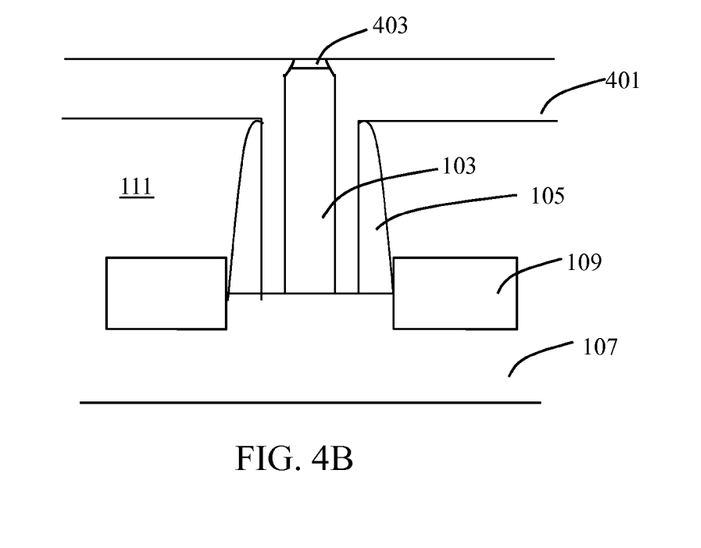

Adverting to FIG. 4B, metal fill 103 is etched back, for example by CMP, stopping on metal gate 401. A thin layer of $Al_2O_3$ 403 may be formed during the CMP process, for example to a thickness of 3 nm to 5 nm.

Figure 4C:
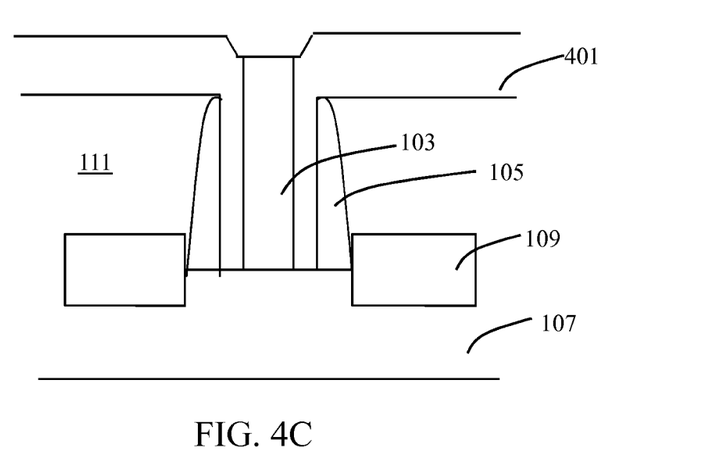

As illustrated in FIG. 4C, $Al_2O_3$ 403 is etched away into metal fill 103 and metal gate 401 to a depth of 5 nm to 15 nm, by either a dry etch or a wet etch process. For example, a dry etching process such as Ar bombardment or $BCl_3$ based chemistry, or a wet etching process such as by PNA may be employed. The additional thickness of metal gate 401 adds further protection for ILD 111 during the recess process illustrated in FIG. 4C.

Figure 4D:
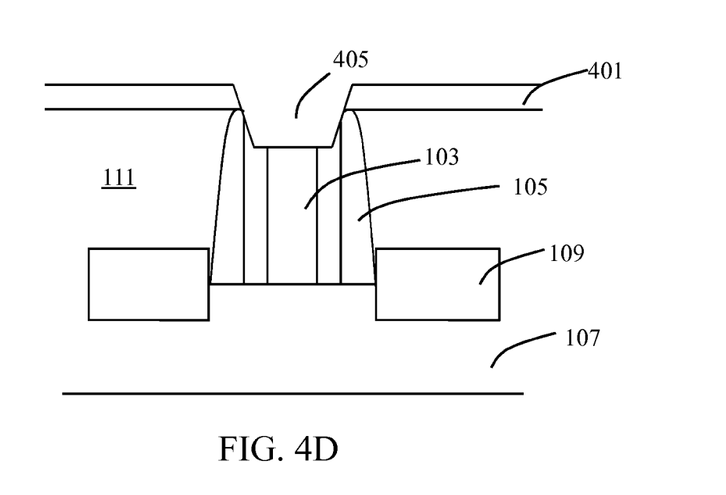

Metal gate 401 and metal fill 103 are then further etched back forming recess 405, for example to a depth of 10 nm to 40 nm, as illustrated in FIG. 4D. A dry etch process, for example a $BCl_3$ based or $CH_3F/HBr/O_2$ based chemistry, may be employed, or a wet etch approach, such as PNA, HCl, or $HNO_3$ may be used.

Figure 4E:
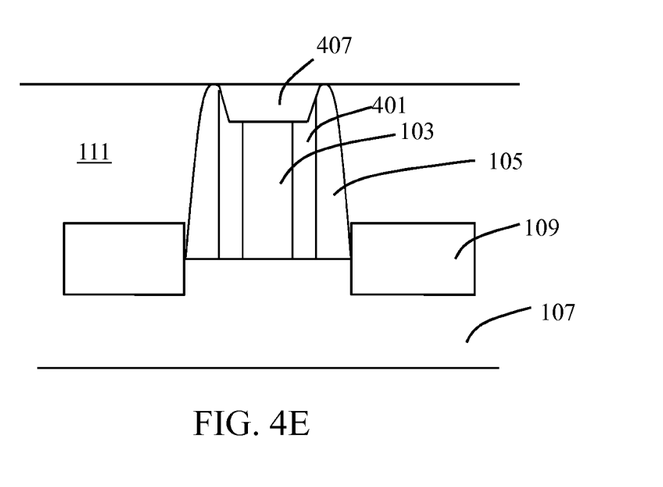

Adverting to FIG. 4E, recess 405 may then be filled with a dielectric material and polished to form dielectric cap 407. Metal gate 401 may concurrently be polished down to ILD 111. The dielectric material may be, for example, SiN, $SiO_2$, or $HfO_2$. The dielectric cap shapes shown in FIGS. 2E through 2H may also apply to the dielectric cap formed by the method of FIGS. 4A through 4E.

Figure 5A:
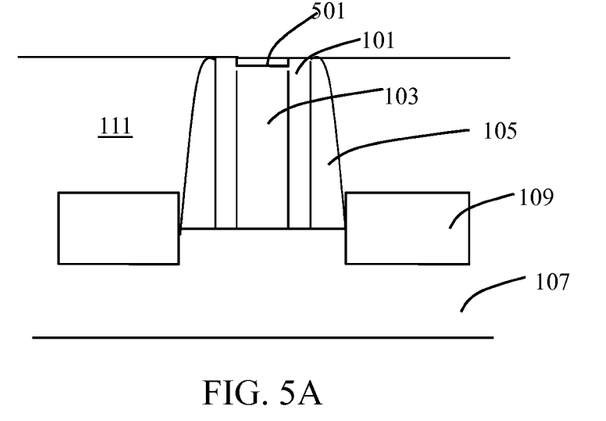
FIGS. 5A through 5E schematically illustrate a process flow for forming a dielectric cap, in accordance with another exemplary embodiment.

FIGS. 5A through 5E illustrate a process flow in accordance with another exemplary embodiment. Beginning with a conventional replaced gate structure as illustrated in FIG. 1, metal gate 101 and metal fill 103 are etched back, for example by CMP, stopping on ILD 111. As illustrated in FIG. 5A, a thin layer of aluminum oxide $(Al_2O_3)$ 501 may be formed during the CMP process, for example to a thickness of 3 nm to 5 nm.

Figure 5B:
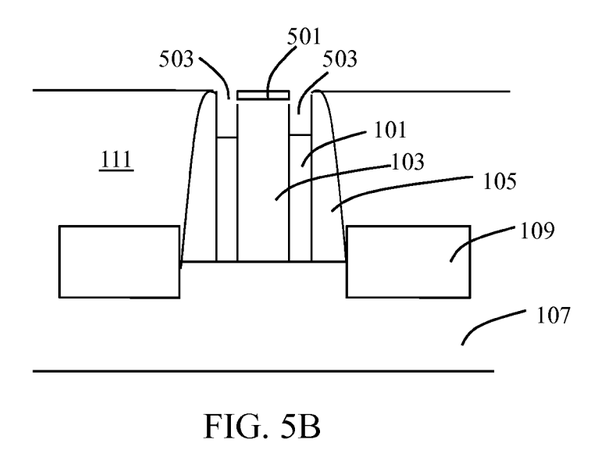

Adverting to FIG. 5B, metal gate 101 is etched back 10 nm to 35 nm by a dry or wet etch, forming recesses 503. The etchant must etch the metal gate but be selective to metal fill 103, for example hot $H_2O_2$.

Figure 5C:
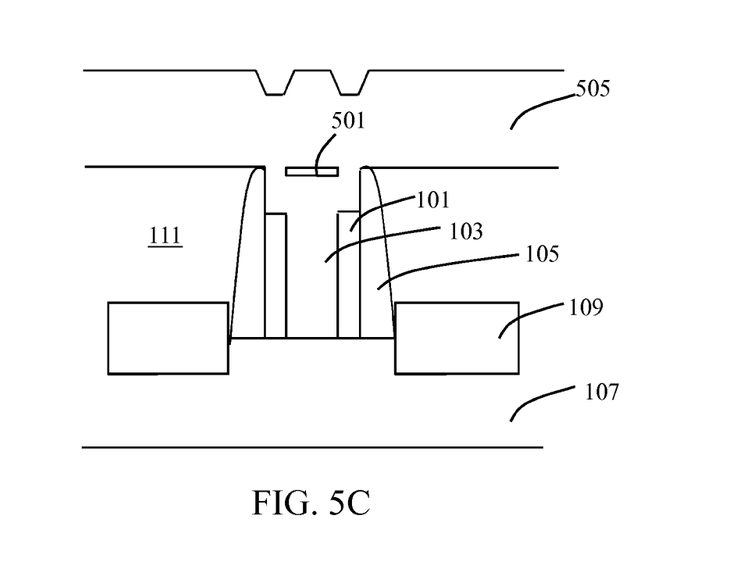
Figure 5D:
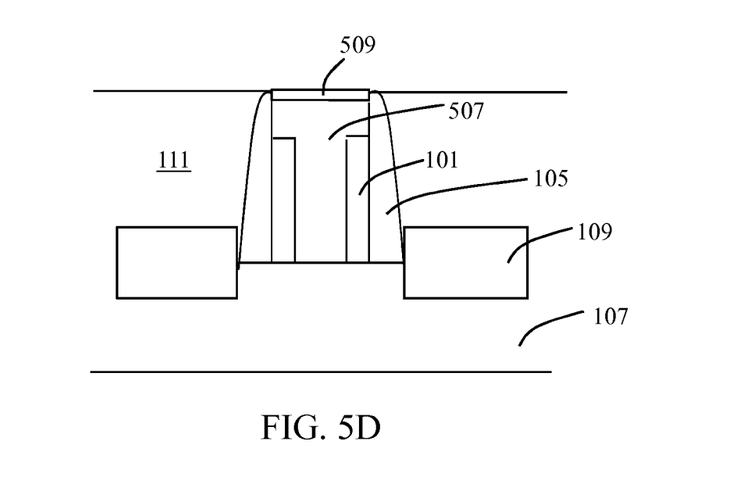
Figure 5E:
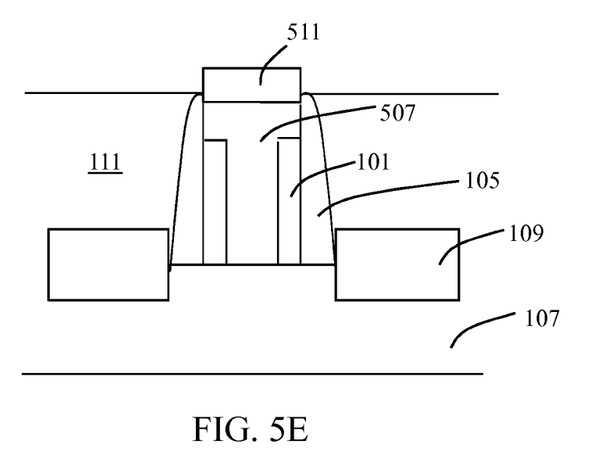

As illustrated in FIG. 5C, Al 505 is deposited over ILD 111, $Al_2O_3$, and recesses 503, filling recesses 503. Then, Al 505 is etched back, for example by CMP, forming metal fill 507. During the CMP, the top of AL 507 is oxidized, and an $Al_2O_3$ layer 509 is formed to a thickness of 3 nm to 5 nm, as shown in FIG. 5D. The layer 509 may be further treated to make the $Al_2O_3$ thicker, for a thicker dielectric cap 511, as illustrated in FIG. 5E, which can be employed as the dielectric cap. As another alternative, the aluminum may be treated, for example by oxidation, nitridation, and/or fluorination, to change the chemistry of layer 509 to another type of insulating material, such as $AlO_xN_y$, $AlF_x$, or $AlF_xO_y$, to form dielectric cap 511 to favor integration requirements. The dielectric cap shapes shown in FIGS. 2E through 2H may also apply to the dielectric cap formed by the method of FIGS. 5A through 5E.

The embodiments of the present disclosure can achieve several technical effects, such as forming a dielectric cap in a replaced gate structure, thereby allowing self-aligned contacts to be formed, and isolating the gate metals from the contacts. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A device comprising:
an interlayer dielectric (ILD) on substrate, the ILD having a cavity;
gate spacers on sidewalls of the cavity;
a first metal lining a bottom portion of the cavity between the gate spacers;
a second metal filling the bottom portion of the cavity, to form a high-k/metal gate stack; and
a dielectric cap in the top portion of the cavity,
wherein the dielectric cap comprises aluminum oxide $(Al_2O_3)$, aluminum oxynitride $(AlO_xN_y)$, aluminofluo- ride (AlF$_x$), or fluorinated aluminum oxide (AlF$_x$O$_y$) and has a thickness of 10 nm to 40 nm.

2. The device according to claim 1, wherein the dielectric cap has vertical sidewalls.

3. The device according to claim 1, wherein the dielectric cap has a T-shape.

4. The device according to claim 1, wherein the dielectric cap has a Y-shape.

5. The device according to claim 1, wherein the dielectric cap has a trapezoidal shape with sidewalls closest to each other at a top surface of the first and second metals.

6. The device according to claim 1, wherein the dielectric cap comprises SiN, SiO$_2$, or HfO$_2$.

7. The device according to claim 1, wherein the dielectric cap has slanted sidewalls.

8. The device according to claim 1, wherein the first metal comprises TiN.

9. The device according to claim 1, wherein the second metal comprises aluminum (Al).

10. The device according to claim 1, further comprising a metal gate between at least one of the gate spacers and the second metal.

11. The device according to claim 10, further comprising a source/drain region on either side of the metal gate.

12. A device comprising:
an interlayer dielectric (ILD) on substrate, the ILD having a cavity;
gate spacers on sidewalls of the cavity;
a first metal lining a bottom portion of the cavity between the gate spacers;
a second metal filling the bottom portion of the cavity, to form a high-k/metal gate stack; and
a dielectric cap having a trapezoidal shape in the top portion of the cavity, the dielectric cap comprising aluminum oxide (Al$_2$O$_3$), aluminum oxynitride (AlO$_x$N$_y$), aluminofluoride (AlF$_x$), or fluorinated aluminum oxide (AlF$_x$O$_y$) and having a thickness of 10 nm to 40 nm.

13. The device according to claim 12, wherein the sidewalls of the trapezoidally-shaped dielectric cap are closest to each other at a top surface of the first and second metals.

14. The device according to claim 12, wherein the first metal comprises TiN.

15. The device according to claim 12, wherein the second metal comprises aluminum (Al).

16. The device according to claim 12, further comprising a metal gate between at least one of the gate spacers and the second metal.

17. The device according to claim 16, further comprising a source/drain region on either side of the metal gate.

* * * * *